(12) United States Patent
Tower et al.

(10) Patent No.: US 10,535,690 B1
(45) Date of Patent: Jan. 14, 2020

(54) EXTENDED DYNAMIC RANGE IMAGING SENSOR AND OPERATING MODE OF THE SAME

(71) Applicant: SRI International, Menlo Park, CA (US)

(72) Inventors: John Robertson Tower, Yardley, PA (US); Robert Michael Guidash, Rochester, NY (US); Peter Alan Levine, West Windsor, NJ (US); Rui Zhu, Princeton, NJ (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 16/175,662

(22) Filed: Oct. 30, 2018

Related U.S. Application Data

(63) Continuation of application No. 15/238,063, filed on Aug. 16, 2016.

(60) Provisional application No. 62/206,417, filed on Aug. 18, 2015.

(51) Int. Cl.
| | |
|---|---|
| *H04N 5/355* | (2011.01) |
| *H01L 27/146* | (2006.01) |
| *H04N 5/3745* | (2011.01) |
| *H04N 5/353* | (2011.01) |

(52) U.S. Cl.
CPC .. *H01L 27/14614* (2013.01); *H01L 27/14603* (2013.01); *H01L 27/14641* (2013.01); *H04N 5/355* (2013.01); *H04N 5/3535* (2013.01); *H04N 5/35554* (2013.01); *H04N 5/37452* (2013.01); *H04N 5/37457* (2013.01)

(58) Field of Classification Search
CPC ...... H04N 5/351; H04N 5/353; H04N 5/3535; H04N 5/35536; H04N 5/3559; H04N 5/3745; H04N 5/37452
USPC .................................................. 348/294, 297
See application file for complete search history.

(56) References Cited

U.S. PATENT DOCUMENTS

| | | | |
|---|---|---|---|
| 3,953,733 A | 4/1976 | Levine | |
| 7,020,353 B1 | 3/2006 | McCaffrey et al. | |
| 8,445,828 B2 * | 5/2013 | He ........................ | H04N 5/3535 250/208.1 |
| 8,766,157 B2 | 7/2014 | Levine et al. | |
| 9,521,333 B2 * | 12/2016 | Hozumi ............... | H04N 5/2355 |

(Continued)

OTHER PUBLICATIONS

Final Office Action for U.S. Appl. No. 15/238,063 dated May 1, 2018, 14 pages.

(Continued)

*Primary Examiner* — Anthony J Daniels
(74) *Attorney, Agent, or Firm* — Rutan & Tucker, LLP

(57) ABSTRACT

An imaging system for capturing light over a wide dynamic range and method for operating the same are provided. In some aspects, the method includes positioning an imaging pixel to image a scene described by light signals that extend over a wide dynamic range, and selecting a different integration time for at least two photodiodes in the imaging pixel based on light signals received by the imaging pixel, wherein the photodiodes are coupled to a sense node, and each photodiode is controlled using a different transfer gate. The method also includes performing a readout of the imaging pixel using a readout circuit connected to the sense node, wherein a capacitance associated with the sense node is modified during the readout of the at least two photodiodes.

18 Claims, 5 Drawing Sheets

(56) References Cited

U.S. PATENT DOCUMENTS

| | | | |
|---|---|---|---|
| 2007/0023798 A1 | 2/2007 | McKee | |
| 2007/0035649 A1* | 2/2007 | McKee | H01L 27/14609 348/308 |
| 2009/0086074 A1* | 4/2009 | Li | H04N 5/23245 348/308 |
| 2011/0019049 A1* | 1/2011 | Jin | H01L 27/14609 348/308 |
| 2013/0300904 A1* | 11/2013 | Sugiyama | H04N 5/3597 348/300 |
| 2015/0055000 A1* | 2/2015 | Bock | H04N 5/35554 348/308 |
| 2015/0201140 A1* | 7/2015 | Solhusvik | H04N 5/3559 348/229.1 |
| 2015/0312461 A1* | 10/2015 | Kim | H01L 27/14609 348/308 |
| 2015/0312557 A1* | 10/2015 | Kim | H04N 5/3535 348/46 |
| 2015/0350583 A1* | 12/2015 | Mauritzson | H04N 5/378 250/208.1 |
| 2016/0028985 A1* | 1/2016 | Vogelsang | H01L 27/14641 348/294 |
| 2016/0037109 A1 | 2/2016 | Vogelsong | |
| 2017/0034411 A1 | 2/2017 | Okura et al. | |
| 2017/0180667 A1* | 6/2017 | Nie | H04N 5/353 |

OTHER PUBLICATIONS

Advisory Action Before the Filing of an Appeal Brief for U.S. Appl. No. 15/238,063 dated Aug. 13, 2018, 3 pages.

Advisory Action Before the Filing of an Appeal Brief for U.S. Appl. No. 15/238,063 dated Sep. 6, 2018, 3 pages.

Non-Final Office Action for U.S. Appl. No. 15/238,063 dated Nov. 6, 2017, 14 pages.

AFCP 2.0 Decision for U.S. Appl. No. 15/238,063 dated Sep. 6, 2018, 1 page.

\* cited by examiner

EXTENDED DYNAMIC RANGE IMAGING SENSOR AND OPERATING MODE OF THE SAME

CROSS-REFERENCE TO RELATED APPLICATIONS

This application claims the benefit under 35 USC 120 of U.S. patent application Ser. No. 15/238,063, titled "Extended dynamic range imaging sensor and operating mode of the same," filed on Aug. 16, 2016, which claimed the benefit of U.S. Provisional Patent Application Ser. No. 62/206,417 filed on Aug. 18, 2015 and entitled "EXTENDED DYNAMIC RANGE (XDR) CMOS PIXEL AND OPERATING MODE" under 35 USC 119. This application incorporates both of these by reference in their entirety.

STATEMENT REGARDING FEDERALLY SPONSORED RESEARCH

This invention was made with government support. The government has certain rights in the invention.

BACKGROUND OF THE INVENTION

The field of the invention relates generally to imaging devices. More particularly, the present disclosure is directed to complementary metal-oxide-semiconductor ("CMOS")-based imaging sensors capable of a wide range of operation.

Imagers typically include an array of pixels that contain light-sensitive elements commonly known as photodetectors, such as CMOS or charge-coupled device ("CCD") sensors. In general, photodetectors accumulate charge in accordance with the incident light during what is known as an integration period. If a photodetector becomes full, or saturated, before the end of the integration period, additional light from a bright scene striking the photodetector does not accumulate any further charge, and stores no further information. As such, many imaging applications require sensors with a wide dynamic range in order to capture inter- and intra-scene lighting variation with high resolution and sensitivity. Specifically, dynamic range refers to the ratio of the maximum signal output to the smallest signal output of a given sensor, which is determined by noise.

CMOS image sensors first came to the fore in relatively low-performance applications where scene dynamic range was low, and moderate to high noise levels could be tolerated. A CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, star trackers, motion detection systems, image stabilization systems, and high-definition television imaging devices.

The advantages of CMOS imagers over CCD imagers are that CMOS imagers have a low voltage operation and low power consumption. Also, CMOS imagers are compatible with integrated on-chip electronics (control logic and timing, image processing, and signal conditioning such as A/D conversion). In addition, CMOS imagers allow random access to the image data. On-chip integration of electronics is particularly advantageous because of the potential to perform many signal conditioning functions in the digital domain (versus analog signal processing) as well as to achieve a reduction in system size and cost.

A number of methods have been introduced to extend the dynamic range of CMOS imagers. For instance, some approaches involve the acquisition of several images with different exposure times, with shorter times capturing brighter scenery and longer times capturing darker scenery. A high dynamic range image is then produced by combining the different images. Another method involves using multiple detectors to capture different copies of the same image, each detector being configured for a predetermined exposure time. Yet another method is based on comparator circuits that allow for saturation detection and reset of individual imaging pixels.

As appreciated from the above, current high dynamic range imaging techniques can either introduce unwanted artifacts or impose a large overhead cost, particularly as pixel sizes shrink and provide less signal output. Therefore, there is a need for new and efficient imaging sensors capable of high sensitivity and resolution over a wide dynamic range.

The foregoing and other aspects and advantages of the invention will appear from the following description. In the description, reference is made to the accompanying drawings that form a part hereof, and in which there is shown by way of illustration preferred embodiments of the invention. Such embodiments do not necessarily represent the full scope of the invention, however, and reference is made therefore to the claims and herein for interpreting the scope of the invention.

DETAILED DESCRIPTION OF THE INVENTION

Appreciable intra-scene light intensity variation poses a significant technical problem for current imaging technologies, resulting in overexposed or underexposed regions that reduce image quality. Although some approaches have aimed at addressing this issue by acquiring multiple image frames with different exposure times, such multiple exposure approach can introduce artifacts due rapid changes in scenery between frames, thus reducing image resolution and quality. Other approaches have utilized pixel redundancy or introduced additional components that have undesirable cost and limited resolution and sensitivity.

Therefore, the present disclosure provides a novel imaging approach using an imaging sensor capable of capturing images under various lighting conditions. Specifically, using a multi-photodetector pixel configuration designed to achieve multiple integration times, high and low gain, and charge binning, the herein provided imaging sensor can provide a wide or extended dynamic range, particularly within single image frames. As may be appreciated, the present disclosure can provide technological advancement for a broad range of applications, including commercial and military surveillance, medical imaging, machine vision, autonomic vehicle imaging, to name a few. In particular, the present disclosure can improve imaging for scenery that includes regions with high and low signal outputs.

Figure 1:
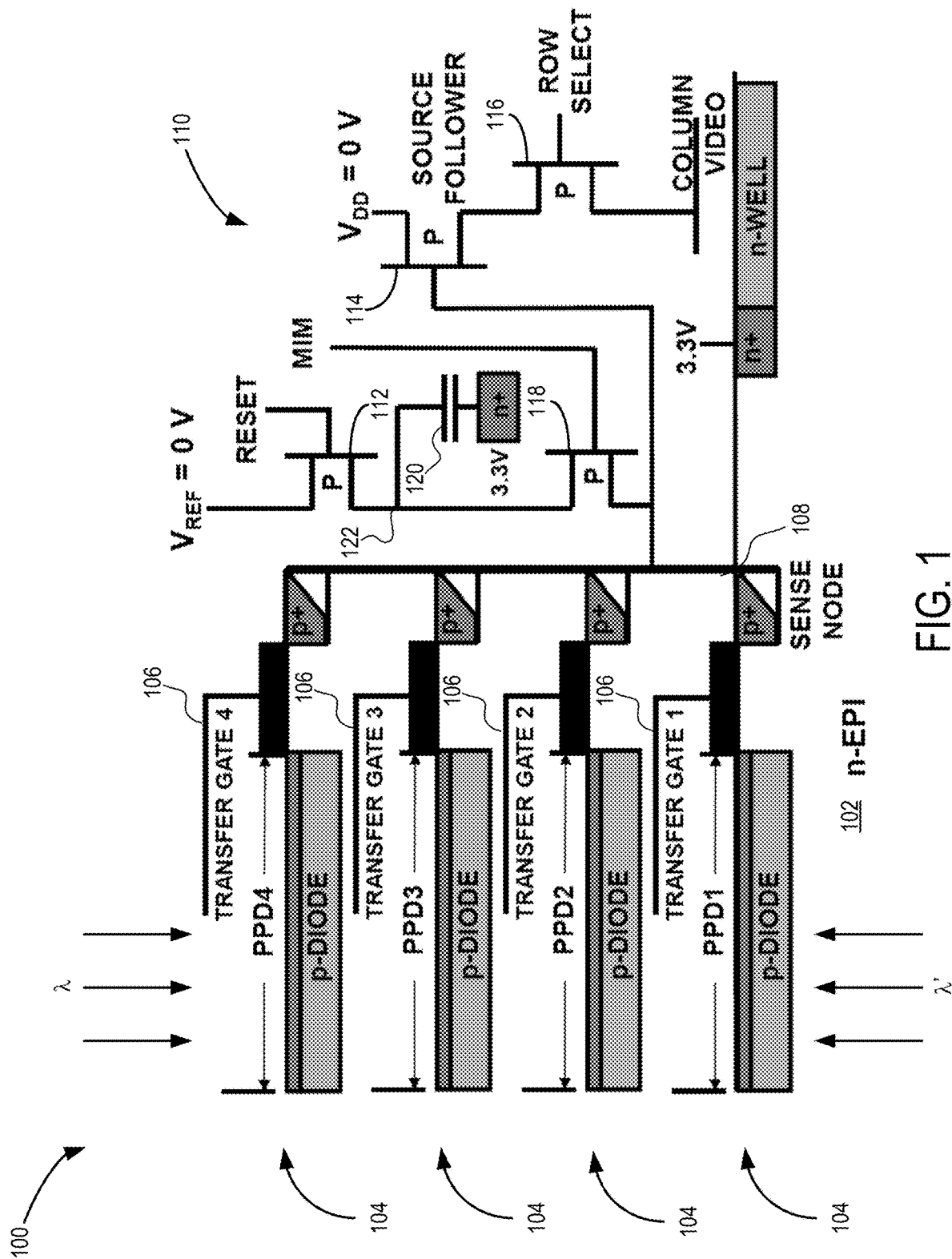
FIG. 1 is a circuit schematic of a CMOS imaging pixel, in accordance with aspects of the present disclosure.

In accordance with one embodiment of the present disclosure, an Extended Dynamic Range (XDR) imaging pixel 100 is shown in FIG. 1. The XDR imaging pixel 100 includes a substrate 102 and four pinned photodiodes 104 formed in the substrate 102, wherein the photodiodes 104 are configured to integrate charge generated due to incident light. As shown in FIG. 1, the light may be directed from the front, or top side of the imaging pixel 100, as indicated by λ, or the back, or bottom side, as indicated by λ', or at any angles therebetween. Herein, the incident light μ, may include ambient or scenery lighting described by a panchromatic spectral range. In particular, the panchromatic spectral range may include wavelengths in the visible portion, the near infra-red portion and ultraviolet portion of the spectrum. As such, active photosensitive areas of the pinned photodiodes 104 may be responsive to the panchromatic spectral range. In some embodiments, active areas of the pinned photodiodes 104 may be responsive to a sub-band of the panchromatic spectral range, as described in co-pending, commonly owned, U.S. patent application Ser. No. 14/796,265, filed Jul. 10, 2015, the disclosure of which is incorporated herein by reference in its entirety. To this end, the imaging pixel 100 may include a filter separating the sub-band (i.e. a color filter). Furthermore, the active areas of the pinned photodiodes 104 may be responsive to a particular polarization. The imaging pixel 100 may include a filter (i.e. a polarization filter) for polarizing the incident light. By way of example, the size of the imaging pixel can be in a range approximately between about 1 and about 20 μm, although other values may be possible.

Each of the pinned photodiodes 104 is connected to a different transfer gate 106 in a configuration that allows independent control of charge accumulation for each of the pinned photodiodes 104. That is, different integration times may be dynamically selected for two or more of the pinned photodiodes 104 to achieve a wide dynamic range for the imaging pixel 100. In some aspects, integration times may be selected based on information from a previous image frame. By way of example, integration times can be in a range approximately between 1 ms and 1 sec, with a dynamic range of up to approximately 10,000,000:1, although other values may be possible.

The pinned photodiodes 104 are coupled to a common sense node 108, allowing for noiseless, charge domain binning. That is, using a single sense node 108 charge accumulated in each of the four pinned photodiodes 104 may be selectively combined. Although FIG. 1 shows four pinned photodiodes 104 as an example, it may be readily appreciated that fewer or more pinned photodiodes 104, each having a different transfer gate 106, may be included in the imaging pixel 100. Preferably, the imaging pixel 100 includes two or more photodiodes 104.

The imaging pixel 100 also includes readout circuitry 110 connected to the sense node 108 that is configured for measuring the charge accumulation in the pinned photodiodes 104. As shown, the readout circuitry 110 includes a reset transistor 112, a source follower transistor 114 and a row select transistor 116. In addition, the readout circuitry 110 also includes a MIM transistor 118 (i.e., a MOSFET switch) and a gain capacitor 120. One terminal of the gain capacitor 120 is electrically connected to an intermediate node 122 between the reset transistor 112 and MIM transistor 118.

Figure 2:
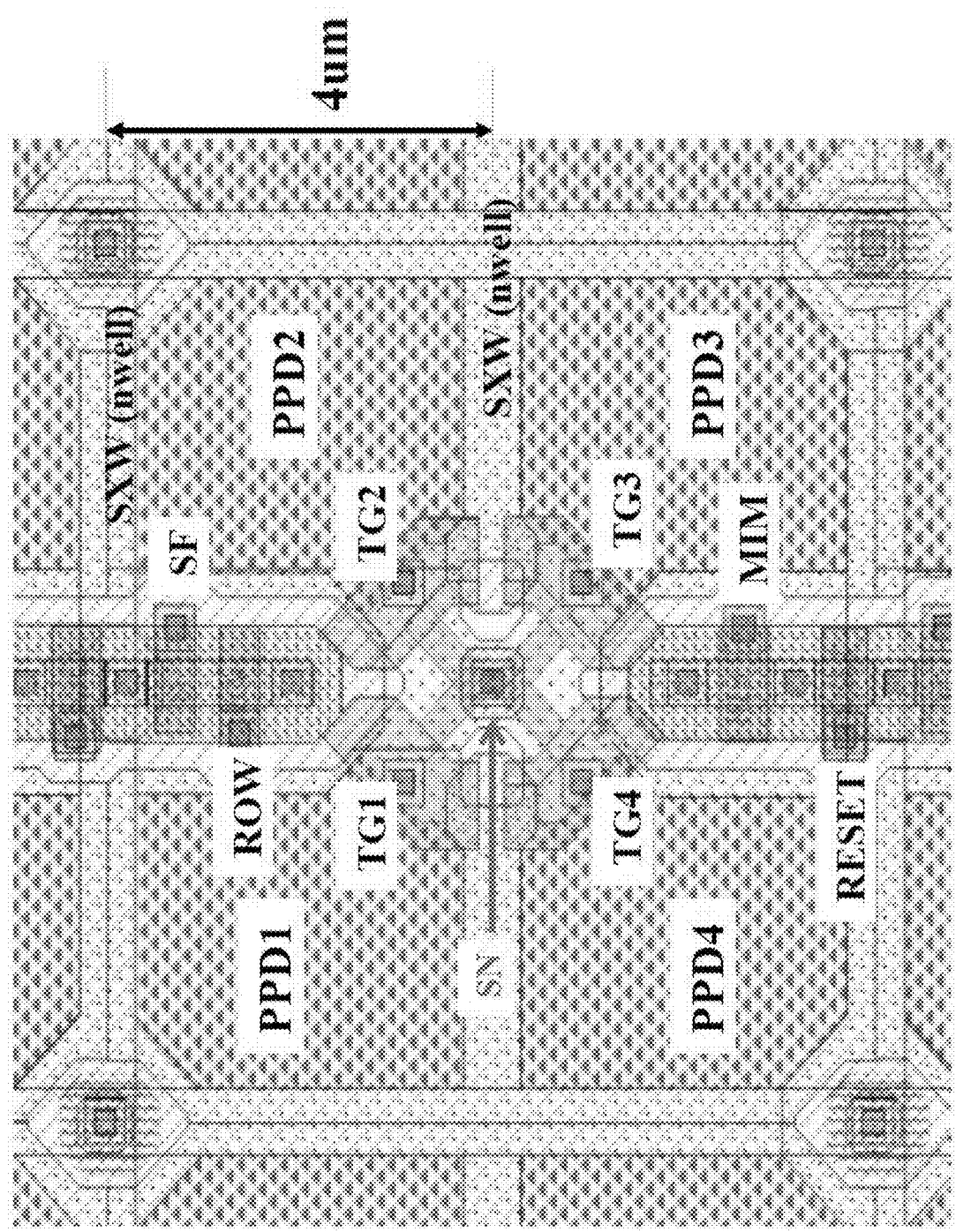
FIG. 2 is an image of a CMOS imaging pixel, in accordance with aspects of the present disclosure.

By way of example, a layout of an imaging pixel is illustrated in FIG. 2. As shown, four pinned photodiodes ("PPDs") are depicted in a quad-pixel configuration, each with their associated transfer gates (i.e. TG 1, TG2, TG3, and TG4). The sense node is labeled in the center (SN) of FIG. 2. The four readout transistors labeled SF, ROW, MIM and RESET, refer to the source follower, row, metal-insulator-metal and reset transistors, respectively. As shown, the size of each PPD can be approximately 4 μm×4 μm.

Figure 3:
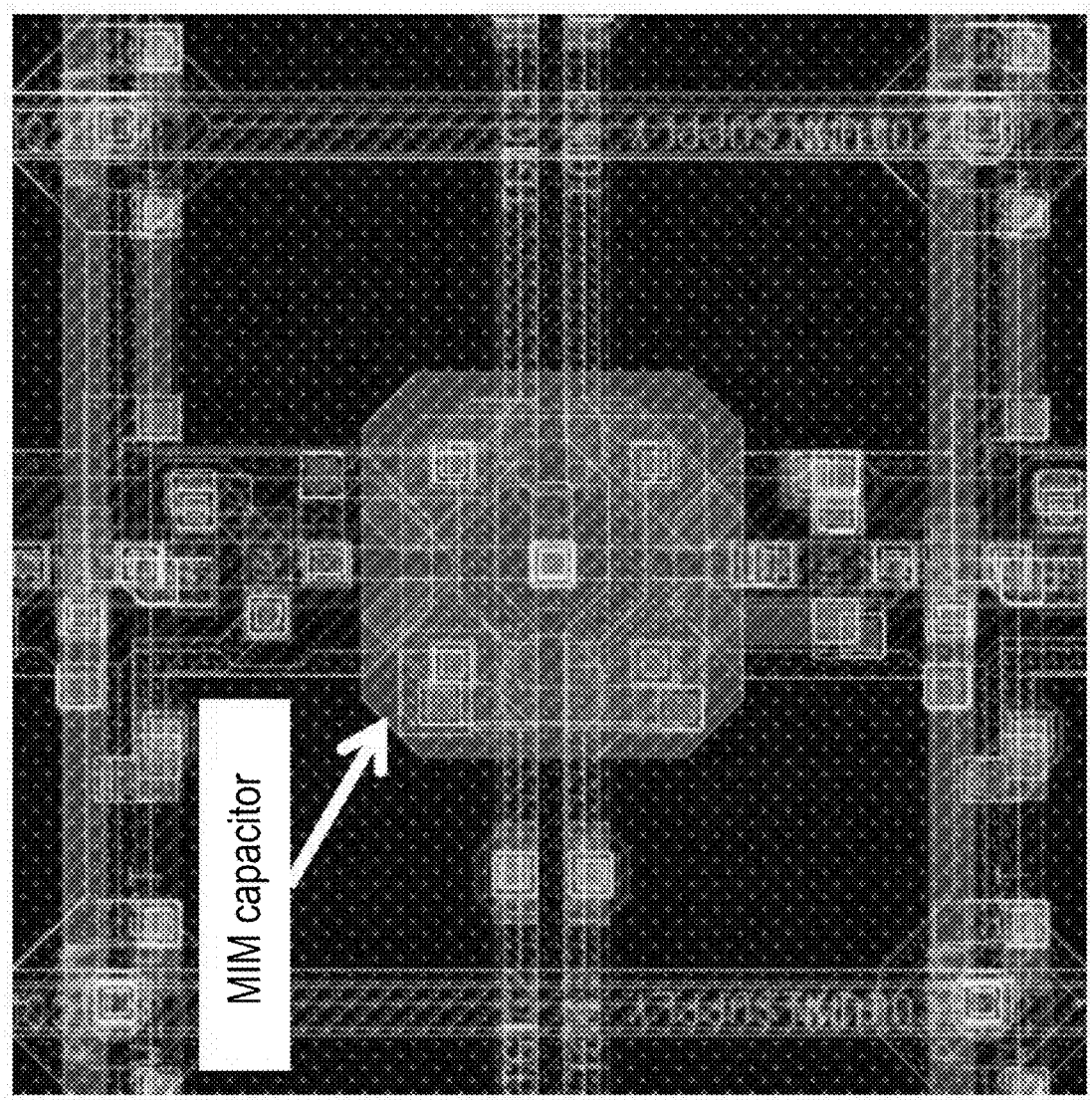
FIG. 3 is an image of another CMOS imaging pixel, in accordance with aspects of the present disclosure.

Referring again to FIG. 1, the capacitance of the gain capacitor 120 can be selected based upon a predetermined dynamic range of the imaging sensor. For example, the capacitance may be in a range approximately between 1 $fF/\mu^{m2}$ and 10 $fF/\mu^{m2}$, although other values may be possible. In some implementations, the gain capacitor 120 may be a metal-insulator-metal capacitor, formed by a multi-level metal stack with dielectric thickness configured to achieve high capacitance per unit area as described in co-pending, commonly owned, U.S. patent application Ser. No. 13/169,242, filed Jun. 27, 2011, the disclosure of which is incorporated herein by reference in its entirety. By way of example, a layout of the quad-pixel configuration showing a metal-insulator-metal ("MIM") gain capacitor is illustrated in FIG. 3.

During operation of the imaging pixel 100, the MIM transistor 118 may be used to select a high or low V/e—gain by selectively allowing the gain capacitor 120 to be connected to the sense node 118. In this manner, a wide dynamic range may be achieved. Specifically, when the gain capacitor 120 is connected to the sense node 108 after a reset operation, a low gain, higher saturation level can be achieved for the imaging pixel 100. If the gain capacitor 120 is not connected, the sense node 108 has a much lower capacitance that allows a high conversion gain for a lower readout noise. The sense node 108 reset occurs when both reset transistor 112 and the MIM transistor 118 are activated. In some embodiments, the imaging pixel 100 may also include capabilities for addressing blooming effects, which occur when charge capacity is exceeded and additional charges spill into neighboring pixels. For example, the imaging pixel 100 may include a clamping circuit (not shown in FIG. 1), as well as other circuits or capabilities.

As shown in FIG. 1, the imaging pixel 100 may be configured as a p-type CMOS pixel. That is, the pinned photodiodes 104 are based on p-type semiconductor materials. However, in another embodiment, the conductivity type of the pinned photodiodes 104, and other doped regions of the imaging pixel 100 may be reversed to form a functioning n-type CMOS pixel. In an n-type imaging pixel (otherwise known as an NMOS pixel), the carrier type is electrons, while in a p-type imaging pixel (otherwise known as a PMOS pixel), the carrier type is holes. In some embodiments, the n-type or p-type imaging pixels/imagers may be either front-illuminated or back-illuminated.

In some embodiments, an imaging system for imaging a scene described by light signals that extend over a wide dynamic range is provided. The imaging system may include an imaging sensor or imager that is formed using one or more arrays of imaging pixels, as described with reference to FIG. 1. The imaging system may also include a controller for controlling the operation of the imaging pixels in the imaging system. In particular, the controller may be configured to read out signals from each imaging pixel using its associated source follower, reset and row select transistor, as described, each imaging pixel producing a voltage signal on a column bus (which has a current source load). Readout of the imaging pixels in the imaging sensor may be performed using a variety of techniques known in the art. For example, a rolling shutter integration technique may be performed by the controller. The controller may then be configured to assemble one or more image frames using the signals from multiple imaging pixels in the imaging sensor.

In some aspects, the controller may be configured to analyze a scene, and based on scene content, such as regions of different light intensities, adapt the operation of different pixels in the imaging sensor for optimal sensitivity. For example, the controller may modify durations of exposure, integration times, and gain settings of individual pixels based on the light intensity information. In one implementation, the controller may be configured to select a different integration time for different photodiodes in an imaging pixel based on light signals received by the imaging pixel, and perform a readout of the imaging pixel, where the capacitance associated with the sense node is modified during the readout to modify the gain. In particular, the capacitance may be modified based upon a predetermined dynamic range of the scene, or based on analyzed scene content. In one example, the controller may operate a quad-type imaging pixel using 4 different integration times, read out from the shortest integration time to the longest, and at least one of the shorter times being operated with the capacitance, i.e. gain, being modified at least once. In another example, the controller may operate a quad-type imaging pixel using 3 different integration times, two pixels having the same integration time and signals therefrom being binned together, with the gain being modified at least once during the readout. These are mere examples, and it may be readily appreciated that any combination of operational modes are possible.

In some aspects, different imaging pixels in an imaging sensor may be responsive to different sub-bands of the panchromatic spectral range, as described Therefore, the controller may be configured to operate respective imaging pixels in the imaging sensor in accordance with the different sub-bands.

Figure 4:
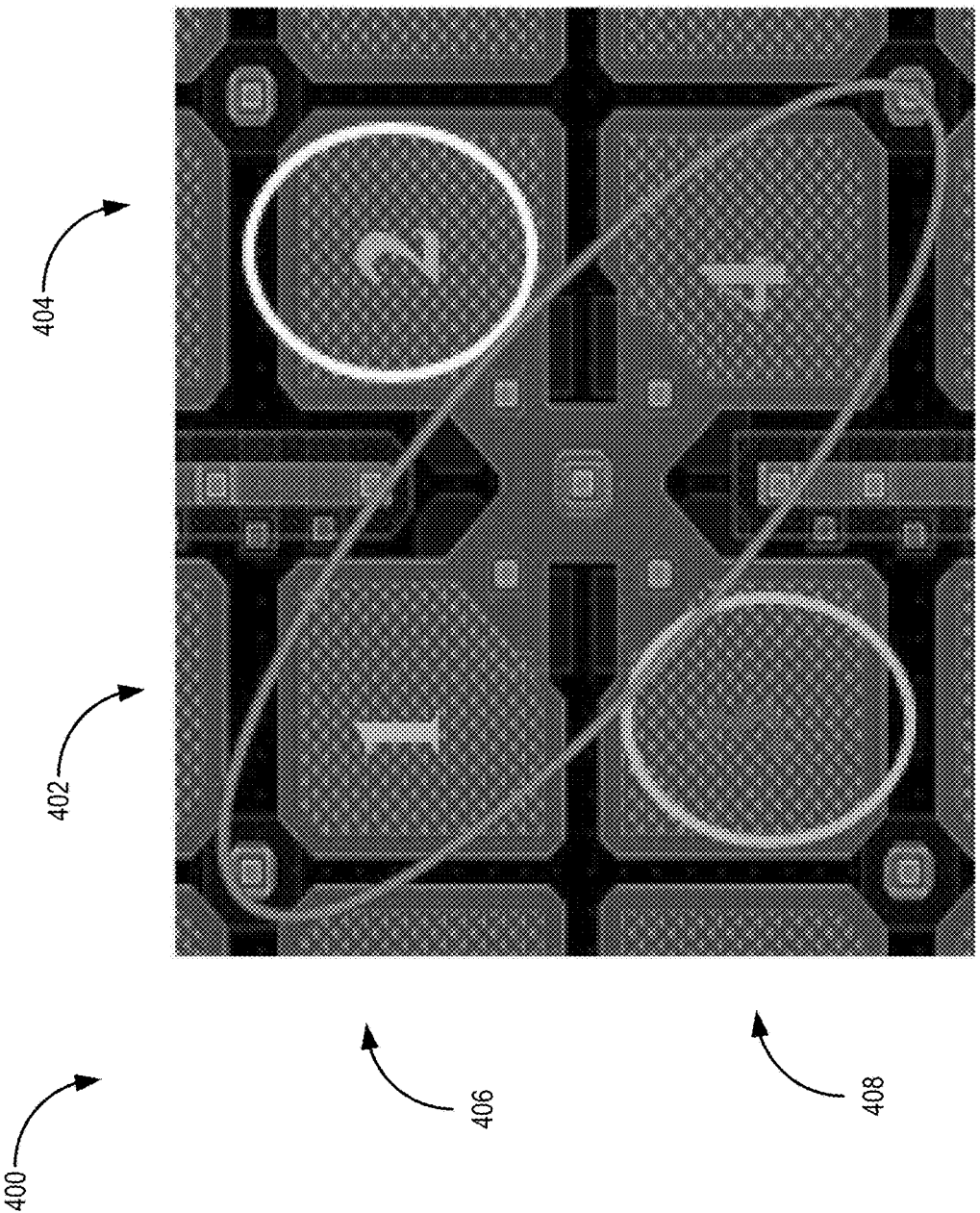
FIG. 4 is an image illustrating a mode of operation of a CMOS imaging pixel, in accordance with aspects of the present disclosure.

Referring now specifically to FIG. 4, an image illustrating a mode of operation of an imaging pixel 400 in a quad-pixel configuration, in accordance with aspects of the present disclosure, in shown. In particular, to achieve a wide dynamic range for single image frames, as described, the imaging pixel 400 may be operated using three signal readouts, each having a different integration time, although other signal readouts may be possible. For instance, to capture the low-range imagery photodetectors "1" and "4", located on the left 402 of the top row 406 of the imaging pixel 400 shown in FIG. 4, may be operated at the 4 fps integration time of 250 ms, for example, with high gain for highest SNR, and signals being binned together. To capture mid-range imagery photodetector "2", located on the right 404 of the top row 406 of the imaging pixel 400, can integrate for 25 ms and be read out in low gain, for example. Furthermore, to capture the high-range imagery pixel "3", located on the left 402 of the bottom row 408 of the imaging pixel 400, can integrate for 1.25 ms and be read out in low gain, for example. As described, gain may be controlled by selectively coupling a gain capacitor. In this manner, a 10,000,000:1 dynamic range may be obtained, for example, assuming a noise floor of 1 h+, a pinned photodiode saturation level of 50,000 h+ and the factor of 200× in integration time.

The three signal outputs can then be measured and the best signal or a combination of the signals may then be scaled by integration time and used for display and radiometric accuracy analysis. In some aspects, non-linearity and calibration of the signal chain for each imaging pixel can be taken into consideration. One of ordinary skill would readily recognize that variations on the above mode of operation are also possible. For instance, long integration times can be greater than 250 ms and the shortest integration times can be the line time, which is typically less than 0.024 ms. Also, each photodetector may use a different integration time.

In the above-described mode of operation, handling the extremely wide dynamic range may tax the anti-blooming capability in the quad-pixel configuration. To address this concern, the shortest integration time signal may be read out first, followed by the middle integration time, and then the longest integration time. Furthermore, the transfer gates may be operated such that the pinned photodiodes can spill through the sense node to the reset drain before charge has a chance to spread to adjacent imaging pixels.

Figure 5:
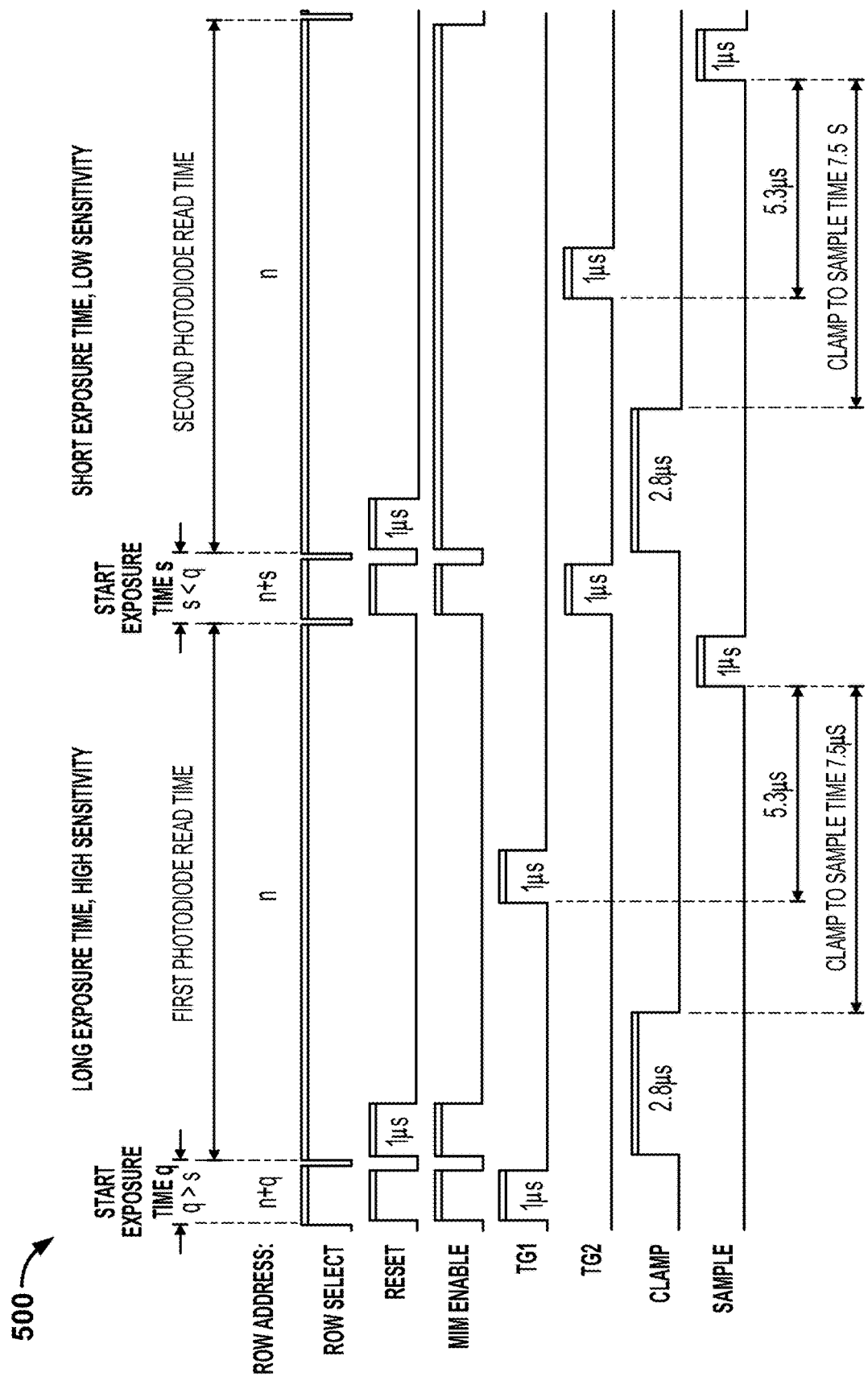
FIG. 5 is a diagram illustrating a mode of a operation of a CMOS imaging pixel, in accordance with aspects of the present disclosure.

Referring now to FIG. 5, an example timing diagram 500 for operating an imaging pixel, in accordance with aspects of the present disclosure. Specifically, this example shows the operation of an imaging pixel having two photodiodes in a row, both coupled to a sense node and having a separate charge transfer gate coupled thereto. The imaging pixel also includes a gain capacitor selectively connectable to the sense node, as well as readout circuitry for measuring charge being accumulated in the photodiodes. In some implementations, the readout circuitry includes a reset transistor, a source follower transistor, a row select transistor, and a correlated double sampling (CDS) circuit. In particular, the CDS circuit may be located in proximity to the imaging pixel or attached via a common signal line to a location outside of the imaging area of the imaging pixel.

Referring specifically to FIG. 5, the timing diagram 500 shows the activation of a ROW SELECT, which chooses the row connected to a column signal line, a RESET, which resets the sense node diode voltage to a reference voltage, and a MIM ENABLE, which connects or disconnects a gain capacitor from the sense node. The timing diagram 500 also shows activation of a TG1, which is the charge transfer gate for the first photodiode, a TG2, which is the charge transfer gate for the second photodiode, a CLAMP, which activates the correlated double sampling circuit (CDS) to store the value of sense node zero signal voltage, and a SAMPLE, which activates the CDS circuit to store the signal voltage after charge is transferred to the sense node.

In operating the first photodiode, the exposure time is started by resetting the first photodiode charge to zero using the RESET. Specifically, the first integration time is started during the time period labeled START EXPOSURE TIME, q. During the readout time of the first photodiode, the MIM ENABLE is shown to be off, and as such the charge-to-voltage conversion is determined by the capacitance of the sense node. Although low noise is maintained, signal output saturation occurs at a relatively low signal level. Similarly, in operating the second photodiode, the exposure time is started by resetting the second photodiode charge to zero using the RESET. Specifically, the second integration time is started during the time period labeled START EXPOSURE TIME, s. During the readout time of the second photodiode, the MIM ENABLE is shown to be on. This connects the gain capacitor to the sense node, thus modifying the capacitance across the sense node. Connecting the gain capacitor changes the charge-to-voltage conversion value and enables a higher charge signal to be stored on the sense node.

In this example, the row time was selected to be approximately 24 μs to permit both photodetectors to be read out with a ADC conversion rate consistent with moderate rate column parallel ADCs. The clamp to sample time of 7.5 μs was selected to be consistent with dominant time constant being targeted for low noise pixels and analog signal processing. The row address n+k time slots was used to reset rows not being read out, to achieve sub-frame integration time. It may be readily appreciated that other timings may be possible.

As shown in FIG. 5, the integration time of the first photodiode was selected to be longer compared to the integration time of the second photodiode. This allows for an increased performance of the first photodiode at low light levels due to the longer exposure. On the other hand, a higher number of photons can illuminate the second photodiode before saturation, at the cost of degraded low light performance due to increased noise floor. However, by virtue of combining these into a single imaging pixel, a wide range of light signals can be measured. That is, by using combining information from each of the photodiodes, a greater intra-scene dynamic range can achieved, spanning low and high light levels.

As described with reference to FIGS. 1-4, imaging pixels in accordance with the present disclosure may include more than two photodiodes in various configurations, and signals produced therein may be readout out individually or in various combinations. As such, the example timing diagram 500 may be readily adapted to these variations. For example, in a quad-pixel configuration having four photodiodes, a different row of can be read out in a similar manner as described above, either using the same or a different combination of timing and gain operations.

The present invention has been described in terms of one or more embodiments, and it should be appreciated that many equivalents, alternatives, variations, and modifications, aside from those expressly stated, are possible and within the scope of the invention.

ADDITIONAL EXAMPLES

Illustrative examples of the technologies disclosed herein are provided below. An embodiment of the technologies may include any one or more, and any combination of, the examples described below.

In an example 1, an system for imaging a scene described by light signals that extend over a wide dynamic range is provided. The system includes an imaging sensor comprising a plurality of imaging pixels, each imaging pixel comprising a substrate, two or more photodiodes formed in the substrate that are coupled to a sense node, each photodiode having connected thereto a different transfer gate for selectively controlling a charge accumulation therein due to an incident light, a gain capacitor selectively connectable to the sense node, and readout circuitry for measuring the charge accumulation, the readout circuitry being connected to the sense node and comprising a reset transistor, a source follower transistor, and a row select transistor. The system also includes a controller configured to operate the imaging sensor by selecting a different integration time for at least two photodiodes in an imaging pixel based on light signals received by the imaging pixel, performing a readout of the imaging pixel, wherein a capacitance associated with the sense node is modified during the readout of the at least two photodiodes, and assembling an image using signals obtained from the plurality of imaging pixels in the readout.

An example 2 includes the subject matter of example 1, wherein the at least two photodiodes comprise pinned photodiodes.

An example 3 includes the subject matter of any of examples 1 and 2, wherein the at least two photodiodes comprise p-type diodes.

An example 4 includes the subject matter of any of examples 1, 2, and 3, wherein the gain capacitor is a metal insulator metal ("MIM") capacitor.

An example 5 includes the subject matter of any of examples 1, 2, 3, and 4, wherein each imaging pixel comprises four photodiodes coupled to the sense node.

An example 6 includes the subject matter of any of examples 1, 2, 3, 4, and 5, wherein a capacitance of the gain capacitor is selected based upon a predetermined dynamic range of the imaging sensor.

An example 7 includes the subject matter of any of examples 1, 2, 3, 4, 5, and 6, wherein the capacitance is in a range approximately between 1 fF/μm$^2$ and 10 fF/μm$^2$.

An example 8 includes the subject matter of any of examples 1, 2, 3, 4, 5, 6, and 7, wherein a size of each imaging pixel is in a range approximately between 1 and 20 μm.

An example 9 includes the subject matter of any of examples 1, 2, 3, 4, 5, 6, 7, and 8, wherein at least one imaging pixel in the array is responsive to a sub-band of a frequency spectrum describing the incident light.

An example 10 includes the subject matter of any of examples 1, 2, 3, 4, 5, 6, 7, 8, and 9, wherein at least one imaging pixel in the array comprises a color filter.

In an example 11, a method for operating an imaging pixel having two or more photodiodes coupled to a sense node, each photodiode controlled using a different transfer gate, the methods includes the steps of positioning the imaging pixel to image a scene described by light signals that extend over a wide dynamic range, and selecting a different integration time for at least two photodiodes in the imaging pixel based on light signals received by the imaging pixel. The method also includes the steps of performing a readout of the imaging pixel using a readout circuit connected to the sense node, wherein a capacitance associated with the sense node is modified during the readout of the at least two photodiodes.

An example 12 includes the subject matter of example 11, wherein the imaging pixel comprises four pinned photodiodes coupled to the sense node.

An example 13 includes the subject matter of any of examples 11 and 12, wherein modifying the capacitance associated with the sense node comprises selectively connecting a gain capacitor to the sense node.

An example 14 includes the subject matter of any of examples 11, 12, and 13, wherein the integration time is in a range approximately between 1 ms and 1 sec.

An example 15 includes the subject matter of any of examples 11, 12, 13, and 14, wherein the method further comprises combining an accumulated charge of two or more photodiodes of the imaging pixel.

An example 16 includes the subject matter of any of examples 11, 12, 13, 14, and 15, wherein different integration times are selected for two or more photodiodes to achieve a wide dynamic range for the imaging pixel.

An example 17 includes the subject matter of any of examples 11, 12, 13, 14, 15, and 16, wherein the wide dynamic range is up to approximately 10,000,000:1.

An example 18 includes the subject matter of any of examples 11, 12, 13, 14, 15, 16, and 17, wherein the method further comprises filtering the incident light received by one or more photodiodes in the imaging pixel.

An example 19 includes the subject matter of any of examples 11, 12, 13, 14, 15, 16, 17, and 18, wherein the method further comprises performing a readout of multiple imaging pixels in an array to generate a image frame.

An example 20 includes the subject matter of any of examples 11, 12, 13, 14, 15, 16, 17, 18, and 19, wherein the integration time of one or more of the at least two photodiodes is selected based on information from a previous image frame.

The invention claimed is:

1. A system for imaging a scene, comprising:
    an imaging sensor comprising a plurality of imaging pixels, each imaging pixel containing two or more photodiodes that are coupled to a sense node of a readout circuit, each photodiode connected to a different transfer gate for selectively controlling a charge accumulation therein due to light; and
    control circuitry configured
        i) to analyze the scene, and based on scene content of regions of different light intensities within the scene being captured by the plurality of imaging pixels,
        ii) to send control signals to at least the first photodiode and the second photodiode to select different integration times for at least the first photodiode and the second photodiode in the imaging pixel during a readout,
        iii) to measure a signal output of charge accumulation from the first photodiode and a signal output of charge accumulation from the second photodiode, and
        iv) to use, for analysis, the signal output of charge accumulation from the first photodiode, the signal output for charge accumulation from the second photodiode, or a combination signal derived from the signal output of charge accumulation from the first photodiode and the signal output of charge accumulation from the second photodiode.

2. The system of claim 1, where the first photodiode and the second photodiode are formed in a substrate of the imaging sensor.

3. The system of claim 1, further comprising:
    a gain capacitor that is selectively connectable to the sense node using a transistor, where the control circuitry is configured to control the gain capacitor's connection via the transistor to the sense node to change a capacitance associated with the sense node during a readout of the imaging pixel based on both i) analysis by the control circuitry of ambient light and ii) analysis by the control circuitry of the scene content of regions of the different light intensities within the scene being captured by the plurality of imaging pixels.

4. The system of claim 3, where the first photodiode has a first integration time and the second photodiode has a second integration time longer than the first integration time, where the control circuitry, the gain capacitor, and the readout circuit cooperate to read out, in order, from the first photodiode to the second photodiode, and where the control circuitry is configured to electrically connect the gain capacitor to the sense node during readout of the first photodiode and disconnect the gain capacitor from the sense node during readout of the second photodiode.

5. The system of claim 1, where a display screen displays an assembled image using output signals obtained from the plurality of imaging pixels.

6. The system of claim 1, further comprising:
    a gain capacitor in the readout circuit, where the gain capacitor selectively electrically connects to and modifies an amount of capacitance associated with the sense node during readout of the first photodiode and the second photodiode, a value of the gain capacitor being configured to achieve a desired conversion gain and readout noise.

7. The system of claim 1, where the control circuitry is configured to combine the signal output of charge accumulation from the first photodiode and the signal output of charge accumulation from the second photodiode.

8. The system of claim 1, where the first photodiode has a first integration time, the second photodiode has a second integration time longer than the first integration time, and a third photodiode has a third integration time longer than the second integration time, and where the control circuitry and the readout circuit cooperate to read out, in order, from i) the first photodiode to ii) the second photodiode to iii) the third photodiode.

9. The system of claim 1, where the controller is configured to analyze information from a prior image frame and select the different integration times based on the analysis of the information from the prior image frame.

10. A method for operating an imaging sensor having an image pixel with two or more photodiodes coupled to a sense node, where at least two of the photodiodes have a different integration time controlled by control circuitry, comprising:
    configuring the control circuitry to analyze a scene,
    based on scene content of regions of different light intensities within the scene being captured by a plurality of image pixels in the imaging sensor, selecting the different integration times for at least a first photodiode and a second photodiode in the imaging pixel,
    measuring a signal output of charge accumulation from the first photodiode and a signal output of charge accumulation from the second photodiode, and
    using, for display, i) the signal output of charge accumulation from the first photodiode, ii) the signal output of charge accumulation from the second photodiode, or iii) a combination signal derived from the the signal output of charge accumulation from the first photodiode and the signal output of charge accumulation from the second photodiode.

11. The method of claim 10, further comprising:
    forming the first photodiode and the second photodiode in a substrate of the imaging sensor.

12. The method of claim 10, further comprising:
    configuring the control circuitry to selectively connect a gain capacitor to the sense node using a transistor to change a capacitance associated with the sense node during a readout of the image pixel based on both i) analysis by the control circuitry of ambient light and ii) analysis by the control circuitry of the scene content of regions of the different light intensities within the scene being captured by the plurality of image pixels.

13. The method of claim 12, where the first photodiode has a first integration time and the second photodiode has a second integration time longer than the first integration time, the method further comprising:
    configuring the control circuitry, the gain capacitor, and a readout circuit to cooperate to read out, in order, from the first photodiode to the second photodiode, and
    configuring the control circuitry to electrically connect the gain capacitor to the sense node during readout of the first photodiode and disconnect the gain capacitor from the sense node during readout of the second photodiode.

14. The method of claim 10, further comprising:

assembling an image using output signals obtained from the plurality of image pixels, and displaying the image on a display screen.

15. The method of claim 10, further comprising:

configuring the control circuitry to selectively electrically connect a gain capacitor to modify an amount of capacitance associated with the sense node during readout of the first photodiode and the second photodiode, and using the gain capacitor to achieve a desired conversion gain and readout noise.

16. The method of claim 10, further comprising:

combining the signal output of charge accumulation from the first photodiode and the signal output of charge accumulation from the second photodiode.

17. The method of claim 10, where the first photodiode has a first integration time, the second photodiode has a second integration time longer than the first integration time, and a third photodiode has a third integration time longer than the second integration time, the method further comprising:

configuring the control circuitry and a readout circuit to cooperate to read out, in order, from i) the first photodiode to ii) the second photodiode to iii) the third photodiode.

18. The method of claim 10, further comprising:

analyzing information from a prior image frame, where the selecting is based on the analyzing.

* * * * *